United States Patent
Chen et al.

[11] Patent Number: 6,074,915
[45] Date of Patent: Jun. 13, 2000

[54] METHOD OF MAKING EMBEDDED FLASH MEMORY WITH SALICIDE AND SAC STRUCTURE

[75] Inventors: Jong Chen; Chrong Jung Lin, both of Taipei; Hung-Der Su, Kaohsiung County; Di-Son Kuo, Hsinchu, all of Taiwan

[73] Assignee: Taiwan Semiconductor Manufacturing Company, Hsin-Chu, Taiwan

[21] Appl. No.: 09/135,044

[22] Filed: Aug. 17, 1998

[51] Int. Cl.$^7$ .................................................. H01L 21/8247
[52] U.S. Cl. ........................................... 438/258; 438/655
[58] Field of Search .................................... 438/258, 261, 438/264, 652, 655

[56] References Cited

U.S. PATENT DOCUMENTS

| | | | |
|---|---|---|---|
| 5,155,056 | 10/1992 | Jeong-Gyoo | 437/47 |
| 5,229,311 | 7/1993 | Lai et al. | 437/43 |
| 5,658,813 | 8/1997 | Enomoto | 438/258 |
| 5,668,035 | 9/1997 | Fang et al. | 437/239 |
| 5,789,294 | 8/1997 | Choi | 438/258 |

OTHER PUBLICATIONS

S.Wolf et al, "Silicon Processing For The VLSI Era" vol. 1, Lattice Press, Sunset Beach, CA, pp. 176–7, 1986.

*Primary Examiner*—Chandra Chaudhari
*Attorney, Agent, or Firm*—George O. Saile; Stephen B. Ackerman

[57] ABSTRACT

A combined method of fabricating embedded flash memory cells having salicide and self-aligned contact (SAC) structures is disclosed. The SAC structure of the cell region and the salicide contacts of the peripheral region of the semiconductor device are formed using a single mask. This is accomplished by a judicious sequence of formation and removal of the various layers including the doped first and second polysilicon layers in the memory cell and of the intrinsic polysilicon layer used in the peripheral circuits. Thus, the etching of the self-aligned contact hole of the memory cell is accomplished at the same time the salicided contact hole of the peripheral region is formed. Furthermore, the thin and thick portions of the dual-gate oxide of the two regions are formed as a natural part of the total process without having to resort to photoresist masking of one portion of the gate oxide layer with the attendant contamination problems while removing the portion of the gate oxide in the other region of the substrate.

47 Claims, 13 Drawing Sheets

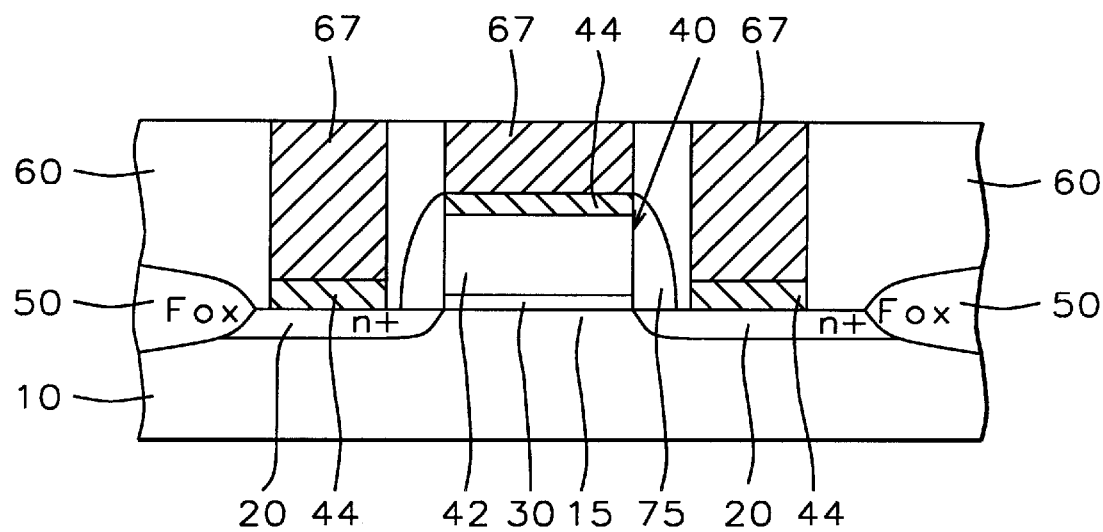
FIG. 1 – Prior Art
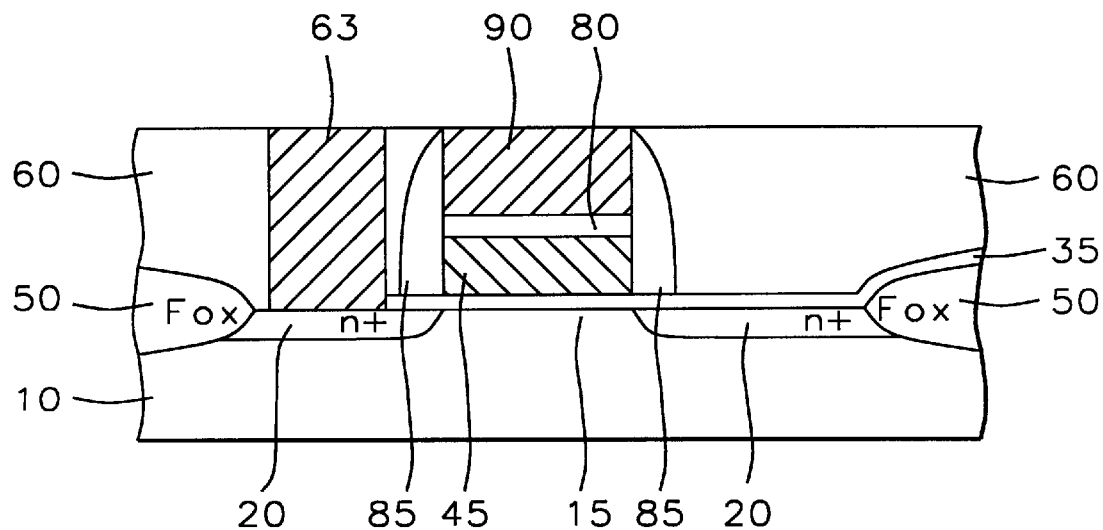
FIG. 2 – Prior Art

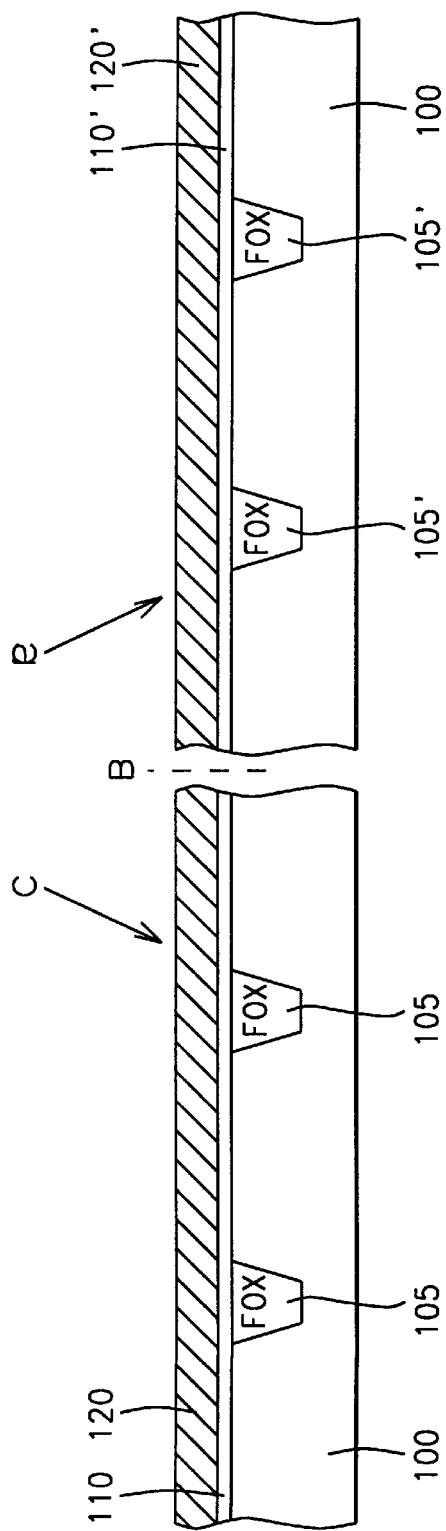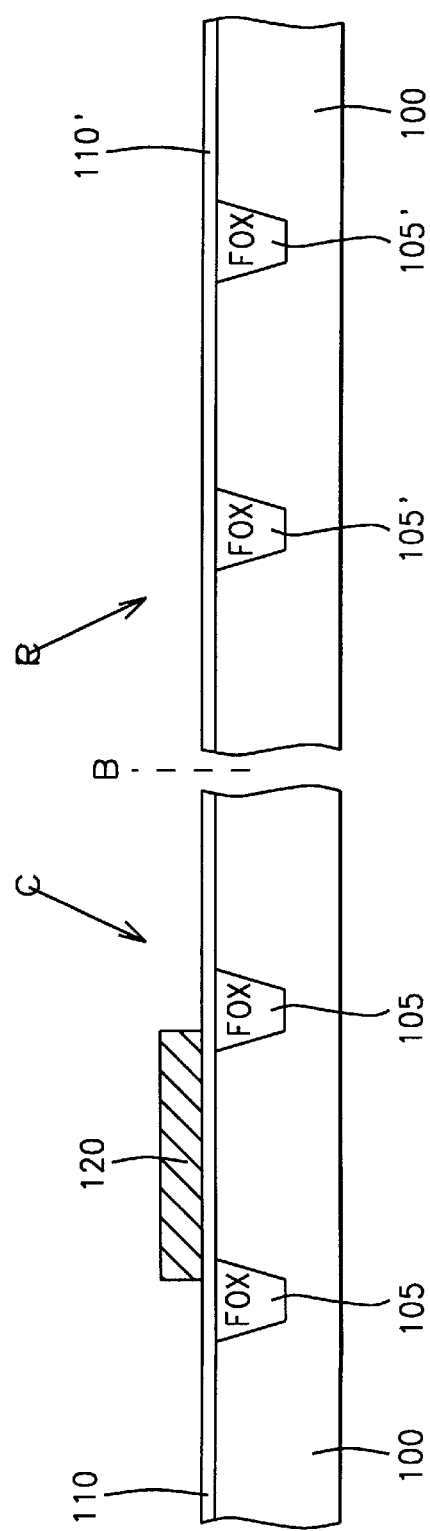
FIG. 3A
FIG. 3B

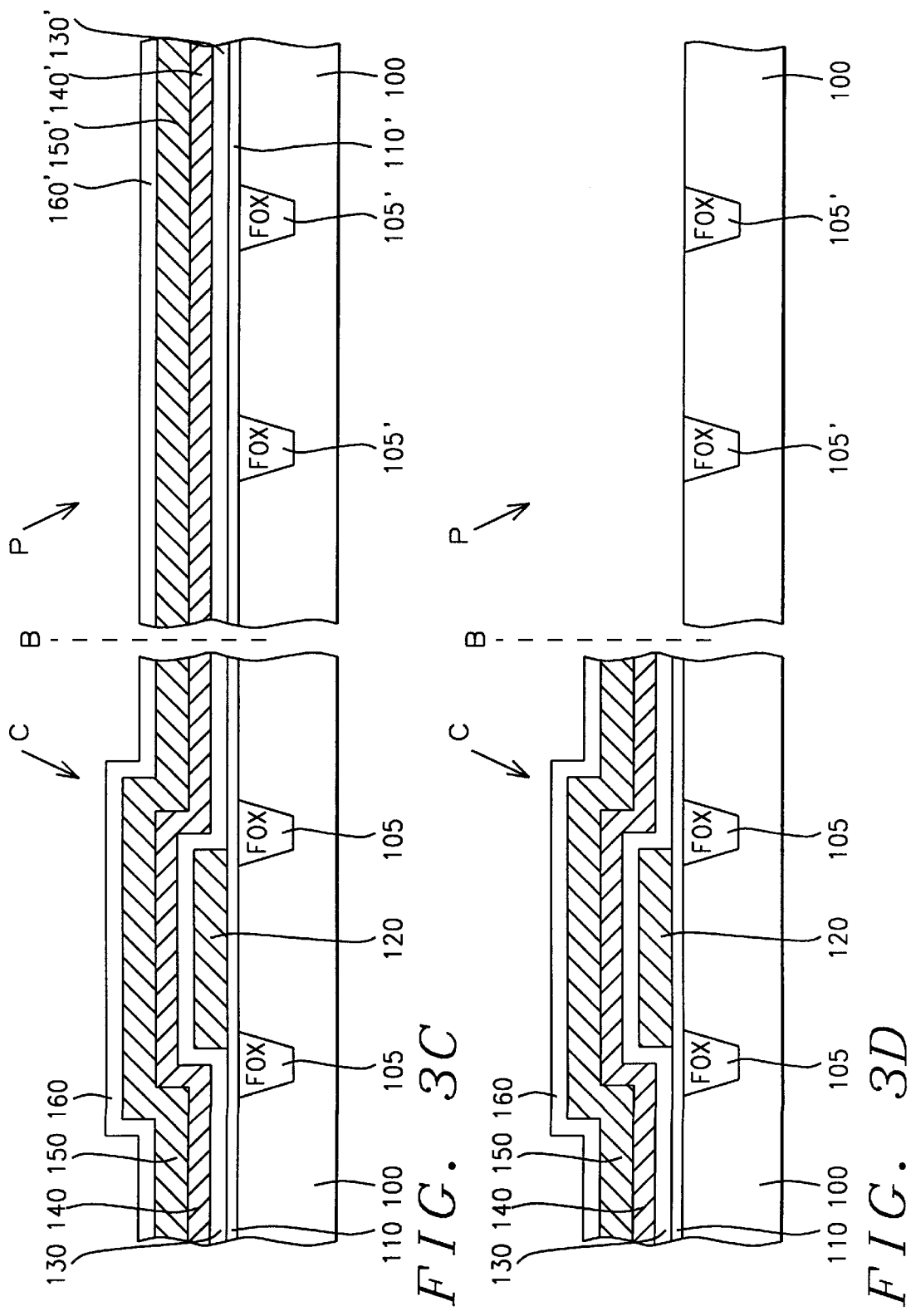

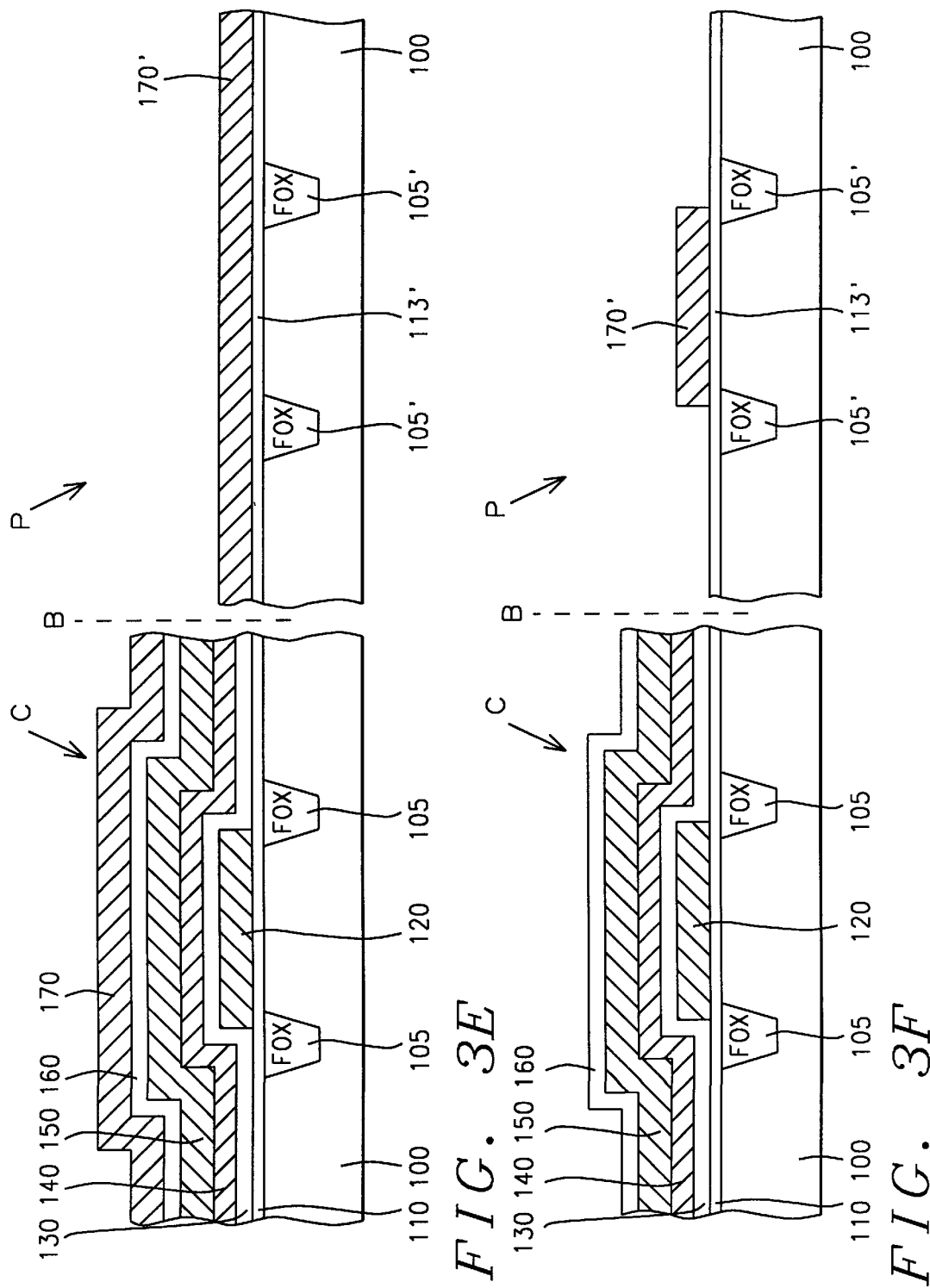

METHOD OF MAKING EMBEDDED FLASH MEMORY WITH SALICIDE AND SAC STRUCTURE

BACKGROUND OF THE INVENTION

(1) Field of the Invention

The present invention relates to manufacturing of semiconductor devices in general, and in particular, to a combined method of fabricating embedded flash memory cells having salicide and self-aligned contact structures.

(2) Description of the Related Art

Very large scale integration (VLSI) and more recently, the ultra scale integration (ULSI) of integrated circuits require semiconductor contact structures that provide high levels of performance. It is well known that in the progression of integrated circuits, as transistor dimensions approached the sub-micron regime, the conventional contacts used up to that point began to limit device performance in several ways. First, it was not possible to minimize the contact resistance when the contact hole was also scaled down for the contact resistance went up inversely with the smaller contact area. In addition, the area of the source/drain regions could not be minimized because the contact hole had to be aligned to these regions with a separate masking step, and extra regions had to be allocated for misalignment. The larger regions also resulted in increased course/drain-to-substrate junction capacitance, which slowed down the device speed. As a result, methods had to be developed to reduce the contact resistance while at the same time minimizing the contact areas commensurate with the large scale integration technology.

One such method used for logic devices is the salicide process and another related process called SAC, or self-aligned contact, is used for memory devices, which are described below. However, salicide and SAC processes are conventionally incompatible when used on the same VLSI or ULSI chip where both logic and memory devices are formed. For example, a dynamic random access memory (DRAM) or nonvolatile electrically programmable read only memory (EEPROM), or other similar memory devices are composed of an array of memory cells for storing digital information, while the peripheral circuits on these devices are typically composed of logic circuits for addressing the memory cells, while other peripheral circuits function as read/write buffers and sense amplifiers. It is disclosed later in the embodiments of this invention a method of using a combined process of salicide and SAC in order to affect scaling down of integrated circuit technology without the attendant redundant masking and other steps that are currently employed.

A conventional self-alignment technique used in forming a typical device is illustrated in FIG. 1. In FIG. 1, gate (40) is formed on an insulator oxide (30) which in turn is formed on a silicon substrate (10) having source/drain regions (20) delineated by field oxide regions (50). The section of the substrate between the source/drain regions (20) is called the channel region (15). The device becomes operational when a voltage $V_g$, larger than a threshold voltage, $V_{th}$, is impressed on gate (40) through a conductive path such that current flows between source and drain regions (20) through channel (15). The source and drain are also connected by means of their own conductive paths (67) to complete the integrated circuit. The conductive paths are interconnections that are fabricated by depositing metal into holes that are formed in interlevel dielectric layer (60) as shown in FIG. 1. It will be shown later that the self-aligned contacts (SACs) in those holes are formed by employing a self-alignment technique.

The physical structure and the electrical characteristics of gate electrode (40) have a controlling effect on the operation of the device. Its forming is usually complex and requires exacting processes. Furthermore, materials used for the gate must be compatible with processes that follow up to the completion of the manufacture of the semiconductor devices. With the advent of ULSI (ultra large scale integration) of devices, the shrinking dimensions of the gate as well as the materials used to form the gates have gained even more significance. Thus, if aluminum were to be used as the gate material for example, then, because of its low melting point, it would have to be deposited following the completion of all high-temperature process steps, including drive-in of the source and drain regions. To form the gate electrode in proper relationship to the source/drain, it must be separately aligned with respect to the source and drain. This alignment process adversely affects both packing density and parasitic overlay capacitances between the gate and source/drain regions. For these reasons, it has become a recent practice to use polycrystalline silicon (poly-Si), which has the same high melting point as the silicon substrate, as the gate material. Hence, polysilicon can now be deposited over the gate to form the gate electrode prior to the source and drain formation. Consequently, the gate itself can serve as a mask during formation of the source and drain regions by either diffusion or ion implantation, as is known in the art. Gate (40) thereby becomes nearly perfectly aligned over channel (15) and with respect to source/drain (20) shown in FIG. 1. The only overlap of the source and drain is due to lateral diffusion of the dopant atoms. This self-alignment feature simplifies the fabrication sequence, increases packing density, and reduces the gate-source and gate-drain parasitic overlap capacitances. For completeness, we note that the threshold voltage, $V_{th}$, of MOS device is also favorably affected by the use of polysilicon as the gate electrode material.

On the other hand, polysilicon has much higher electrical resistance as compared to aluminum, for example, and the miniaturization of devices in the ULSI era has exacerbated the electrical properties of the poly-Si gate electrode. Polysilicon is commonly doped by ion implantation to lower the resistivity substantially. However, according to Wolf in his book "Silicon Processing for the VLSI Era," vol. 1, Lattice Press, Sunset Beach, Calif., 1986, pp. "176–77", even at the highest dopant concentrations, a 0.5 micrometer ($\mu$m)-thick polysilicon film has a sheet resistance of about 20$\Omega$/sq which is about two orders of magnitude larger than that of aluminum film of the same thickness. The resulting high values of line resistance can lead to long propagation delays and severe dc voltage variations within an ULSI circuit.

In order to overcome the high resistivity problem encountered with polysilicon alone, polycides, a multilayer structure comprising polysilicon (42) and metal silicides (44), are used to form gate electrodes (40) such as depicted in FIG. 1. Silicides are a group of refractory metal compounds ($MSi_x$) that are formed by basically three techniques, each of which involves deposition followed by a thermal step to form the silicide: 1) deposition of a pure metal such as tungsten (W), titanium (Ti) or Molybdenum (Mo) on polysilicon, 2) simultaneous evaporation of the silicon and the refractory metal from two sources, and 3) sputter-depositing the silicide itself from a composite target, or by co-sputtering or layering.

In a salicide process, after the polysilicon layer (42) has been deposited and patterned following conventional lithographic and etching methods, sidewall spacers (75) are formed. This is accomplished by depositing a layer of oxide (not shown) which conformally covers the polysilicon layer (42). The oxide layer is then etched back anisotropically until the polysilicon layer is exposed. Unetched portions of the oxide at the vertical sides of the poly-Si remain following this etch. These residual structures then form the oxide spacers (75) shown in FIG. 1. As is well known in the art, the purpose of the spacers is to prevent shorting between metal deposited subsequently on the gate and on the source/drain regions. The metal used to form the silicide (44) is deposited. Substrate (10) is next heated, which causes the silicide reaction to occur wherever the metal is in contact with the silicon. Everywhere else, the metal remains untreated. The unreacted metal at places such as over the spacers is selectively removed through the use of an etchant that does not attack the silicide, the silicon substrate, or the oxide. As a result, in addition to the polysilicon layer (42), only each exposed source and region is now completely covered by silicide film (44) but no other place. It will be noted that the resulting multilayered polycide film over the gate comprising polysilicon and silicide has been self-aligned with respect to the source/drain regions and the combination is accordingly called a self-aligned silicide or, a salicide. A dielectric layer is next deposited onto the salicide, and holes are opened in it down to the salicide layer. Metal is deposited into the holes to make contacts (67) with the salicide.

It will be appreciated by those skilled in the art that the oxide spacers can also be used in memory cells for self-aligning source/drain regions without the need for additional photolithographic step. This is shown in a conventional memory cell of FIG. 2 where a first polysilicon floating gate (45) and second polysilicon control gate (90) have been formed following methods known in the art. The floating gate and the control gate are separated by an intervening interpoly oxide (80). Subsequent to the forming of the gates, oxide spacers (85) are also formed as shown in FIG. 2. The source/drain regions are then formed by ion implantation without the use of a lithography step. The spacer and the field oxide act as masks to prevent the ion implantation from penetrating to the silicon substrate below. Therefore, only the active regions covered by the gate oxide, layer (35) in FIG. 2, are implanted, and hence, the source and drain are self-aligned with respect to the stacked gates, (45), (90), and contact hole (63).

Thus, prior art provides methods of forming salicides and SACs, but with separate and non-integrated steps. The present invention discloses a process where the two methods can be combined advantageously. In addition, and as a by-product, an improved method of forming dual-gate oxide is also disclosed. Here, in order to optimize the performance of memory devices and logic devices on the same integrated chip, it is desirable to provide different thicknesses of the gate oxide for the different types of devices. Typically, a thin gate oxide is used in the peripheral logic circuits to enhance FET device performance, while it is desirable to provide a thicker gate oxide for the higher gate voltage requirement on the on the access transistors of a memory cell. A dual gate oxide is obtained by thermally growing in the memory cell device area and in the logic device area (peripheral area) a first gate oxide on the substrate having a field oxide. A photoresist mask is then used to mask the gate oxide over the memory cell device area, and the gate oxide is etched in the logic device area. The photoresist is then stripped and a second gate oxide is grown on the logic device are while the original gate oxide in the memory cell device area increases in thickness. Unfortunately, though, by the method of the prior art, the presence of the photoresist over the gate oxide in the memory device area contaminates the oxide and degrades the device electrical characteristics. This problem is also alleviated with the disclosed method of this invention.

Fang, et al., of U.S. Pat. No. 5,668,035 avoids the problem of contamination mentioned above by not directly applying the photoresist onto the gate oxide. Jeong-Gyoo in U.S. Pat. No. 5,155,056 discloses a process for forming a cell having a self-aligned capacitor contact and a structure thereof. Lai of U.S. Pat. No. 5,229,311 teaches a method of reducing the degradation effects associated with avalanche injection or tunneling of hot-electrons in a field-effect semiconductor device. The present invention teaches a combined method of forming salicide and SAC structures together while, at the same time, providing a dual gate oxide.

SUMMARY OF THE INVENTION

It is therefore an object of the present invention to provide a combined method of forming salicide and SAC structures in fabricating embedded flash memory cells.

It is another object of the present invention to provide a method of forming salicide and SAC structures in fabricating embedded flash memory cells using a single combined mask.

It is yet another object of the present invention to provide a method of forming dual-gate oxide layer in a flash memory having memory device and peripheral logic device regions.

These objects are accomplished by providing a semiconductor substrate having well regions; defining device regions on said substrate, said device regions comprising a first device region and a second device region; forming field oxide regions surrounding and electrically isolating said device regions on said substrate; forming a first gate oxide layer on said first and second device regions; depositing a first polysilicon layer over said first gate oxide layer and elsewhere on said substrate; doping said first polysilicon layer; patterning by photoresist masking and anisotropic plasma etching said first polysilicon layer leaving portions over said first device region and exposing said first gate oxide over said second device region; forming a first interpoly oxide layer over said portions of said first polysilicon over said first device region and elsewhere on said substrate; depositing a second polysilicon layer over said first interpoly oxide layer on said substrate; depositing a silicide layer over said second polysilicon layer on said substrate; forming a cap layer over said silicide layer on said substrate; removing from second device region the stacked layer of cap layer, said silicide layer, said interpoly and intergate oxides and thus exposing surface area of said semiconductor substrate in said second device region; defining a well region in said second device region; forming a second gate oxide layer over said second device region; depositing an intrinsic polysilicon layer over said first and second device regions on said substrate; patterning by photoresist masking and anisotropic plasma etching said intrinsic polysilicon layer leaving portions over said second device region to form a poly-gate and removing said intrinsic polysilicon from elsewhere on said substrate including said second device regions; performing a first ion implant over said second device region; forming a stacked gate in said first device region; performing a second ion implant over said first device region; defining a device source line in said first device region; performing a third ion implant in said first device region; forming oxide spacers on the side-walls of said stacked gate in said first device region and on the side-walls of said poly-gate in said second device region; performing a fourth ion implant to form source and drain regions; forming a conformal layer covering said first and second device regions; forming a resistor protective oxide layer over said first device region; removing said conformal layer from said second device region; performing salicidation in said second device region; depositing an interlevel dielectric layer over said substrate; etching self-aligned contact holes in said interlevel dielectric layer in said first and second device regions; and forming metal in said self-aligned contact holes to continue with the completion of the manufacturing of the semiconductor devices.

BRIEF DESCRIPTION OF THE DRAWINGS

In the accompanying drawings, similar numerals refer to similar parts throughout the several views.

FIG. 1 is a partial cross-sectional view of a semiconductor substrate showing the forming of conventional salicides.

FIG. 2 is a partial cross-sectional view of a semiconductor substrate showing the use of spacers in the forming of contact holes of a conventional memory cell.

FIG. 3A is a partial cross-sectional view of a semiconductor substrate at a common boundary between a memory cell region and a peripheral logic device region showing the forming of the first gate oxide and first polysilicon layer according to this invention.

FIG. 3B is a partial cross-sectional view of the same semiconductor substrate of FIG. 3A showing the forming of the first polysilicon floating gate of the memory cell, according to this invention.

FIG. 3C is a partial cross-sectional view of the same semiconductor substrate of FIG. 3B showing the deposition of various materials in the forming of the stacked gate of the memory cell, according to this invention.

FIG. 3D is a partial cross-sectional view of the same semiconductor substrate of FIG. 3C showing the removal of the materials deposited from the peripheral region, according to this invention.

FIG. 3E is a partial cross-sectional view of the same semiconductor substrate of FIG. 3D showing the forming of a first intrinsic polysilicon in the peripheral region, according to this invention.

FIG. 3F is a partial cross-sectional view of the same semiconductor substrate of FIG. 3E showing the forming of a single polysilicon gate of the peripheral logic device, according to this invention.

FIG. 3O is a partial cross-sectional view of the same semiconductor substrate of FIG. 3A showing the memory device of this invention with tunnel oxide, according to this invention.

DESCRIPTION OF THE PREFERRED EMBODIMENTS

Figure 3G:
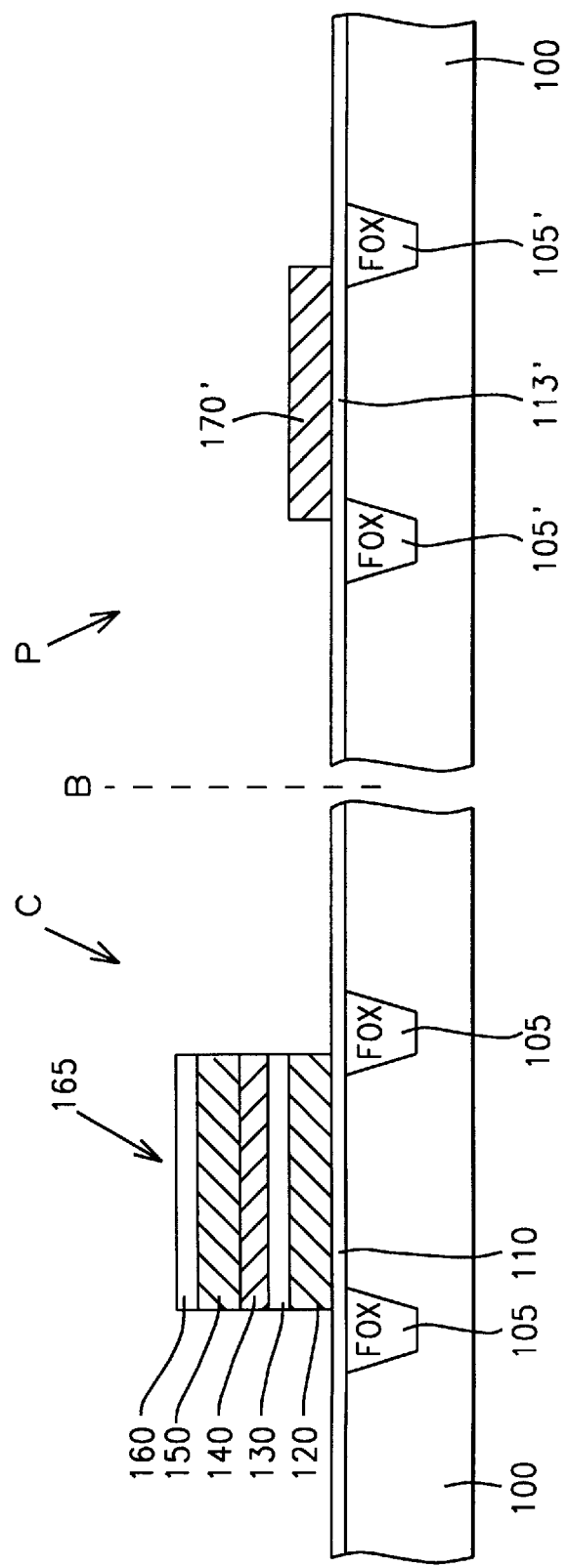
FIG. 3G is a partial cross-sectional view of the same semiconductor substrate of FIG. 3F showing the forming of a stacked gate of the memory cell, according to this invention.

Referring now to the drawings, in particular to FIGS. 3A through 3O, there is shown a combined method of forming salicide and self-aligned contact (SAC) structures in a flash memory with embedded peripheral logic circuits. Though the method is disclosed in conjunction with memory circuits where both P doped and N doped wells are provided for making P- and N-channel FETs, it should be understood that the method equally applies to other semiconductor integrated circuits where both salicide and SAC are desired, including CMOS.

In the drawings in FIGS. 3A–3O, a cross-sectional view of a partially completed flash memory cell formed on and in the surface of a semiconductor substrate (100) is shown having a common boundary (B) separating a memory cell region (C) and a peripheral logic device region (P). Viewing the semiconductor substrate of FIGS. 3A–3O across the boundary region (B) serves to better illustrate how the forming of the self-aligned contact (SAC) of the cell region (C) can be combined with the forming of the salicide contact (C) can be combined with the forming of the salicide contact of the peripheral region (P) using a single combined mask for both. In order to differentiate more readily those portions of the material that are formed over the respective regions, reference numerals referring to the same material parts on the peripheral region are primed while those that are on the cell region are not.

It is preferred that substrate (100) comprises P+type single-crystal silicon having a <100> crystallographic orientation. Peripheral region (P) is of an opposite conductivity N-well while cell (C), formed after defining the active regions, is to be of conductivity P-well. Deep N-well and the subsequent P-well (not shown) are formed, respectively, by ion implanting phosphorous at a dosage level between about $5\times10^{12}$ to $5\times10^{13}$ atoms/cm$^2$ and at an energy between about 100 to 200 KEV, and boron at a dosage level between about $1\times10^{13}$ to $5\times10^{13}$ atoms/cm$^2$ and at an energy between about 20 to 80 KEV. A thick field oxide, FOX, (105) is formed around both the memory and logic device regions to provide electrical isolation between them. The most commonly used field oxide is formed by the method of Local Oxidation of Silicon (LOCOS) in which silicon nitride (Si$_3$N$_4$) layer (not shown) is deposited and patterned leaving portions over device regions. Another commonly used method is the shallow-trench-isolation (STI). The substrate is then subjected to thermal oxidation to oxidize the exposed surface of the silicon substrate to form field oxide (105), as shown in FIG. 3A.

After the forming of the two wells, or tubs as they are sometimes known, and of the active and passive field oxide regions, a first gate oxide layer (110), or tunnel oxide, is formed over the device regions (both logic and memory device regions) of FIG. 3A by thermal oxidation. Gate oxide (110), which will eventually serve as the tunneling oxide for the memory cell access transistor, is preferably grown thermally in dry oxygen in an oxidation furnace at temperature range between about 750 to 1000° C., and to a thickness between about 50 to 200 Å. Alternatively, other oxidation methods can be used, such as oxidation in a dry oxygen and anhydrous hydrogen chloride in atmospheric or low pressure environment, or low temperature, high-pressure, and the like.

A first polysilicon layer (120) is next deposited over gate oxide layer (110) and elsewhere on the field oxide regions, as shown in FIG. 3A. The polysilicon layer is preferably deposited by LPCVD using, for example, silane ($SiH_4$) as the reactant gas, and is deposited in a temperature range of between about 500 to 800° C. The preferred thickness of the first polysilicon layer is between about 500 to 2000 Å. The polysilicon is then in-situ doped by adding a dopant gas, such as phosphine ($PH_3$) to the chemical vapor deposited (CVD) reactant gas silane. Alternatively, the polysilicon can be doped by ion implantation using arsenic ($As^{75}$) or phosphorous ($P^{31}$) ions.

Using conventional photolithographic techniques a phtoresist layer is spin-coated (not shown) on the first polysilicon layer (120) and patterned leaving portions of the photoresist over the memory device region (C) while exposing the polysilicon layer (120') over the peripheral logic region (P). The first polysilicon layer (120') is then etched to the gate oxide layer (110') over the peripheral logic region (P) and the polysilicon (120) over the cell region is formed with a gate pattern which is to serve as a floating gate of the flash memory cell, as shown in FIG. 3B. The etching is performed using anisotropic plasma etching, for example in a reactive ion etcher (RIE), and using an etchant gas such as chlorine ($Cl_2$) and a carrier gas, such as argon (Ar). This results in selective etching of the polysilicon layer (120') to the gate oxide (110').

Referring now to FIG. 3C, after the removal of the photoresist layer of the previous step, another oxide layer (130) is formed, where this layer will serve as an interpoly oxide between the first polysilicon layer and the second polysilicon layer to be deposited. It is preferred that interpoly layer (130) comprises oxide-nitride-oxide (ONO) and is chemical vapor deposited by reacting $SiH_4$ with $N_2O$ and $NH_3$ to a thickness between about 100 to 500 Å. A conformal second polysilicon layer (140) is then formed over the interpoly oxide layer by using LPCVD similar to the deposition for the first polysilicon layer and also in-situ doped. The preferred thickness of the second polysilicon layer is between about 500 to 3000 Å.

At the next step, a layer of silicide, (150) is formed over the second polysilicon layer (140), as seen in the same FIG. 3C. Silicides are formed by depositing metal on silicon (i.e., onto single crystal and/or polycrystalline Si) and then heating it. They can also be formed by simultaneous evaporation of silicon and refractory metal from two sources (co-evaporation), or by sputter-depositing silicide, either from a composite target, or by co-sputtering or layering. It is preferred in this embodiment that tungsten silicide (WSi) be sputter deposited to a thickness between about 500 to 3000 Å. This is followed by forming an oxide layer capping the aforesaid layers as shown in FIG. 3C. The oxide capping layer (160) is oxynitride (ON) and has a thickness between about 500 to 5000 Å. It will be noted from FIG. 3C that the layers, including the ON layer, cover all regions of the substrate including the cell region (C) and the peripheral region (P), where the layers in the (P) region are indicated by primed numerals, namely, (110'), (130'), (140') (150') and (160'). The ON layer is then used to protect the cell (C) region while all the layers in the peripheral (P) region are removed down to the silicon surface of substrate (100) as shown in FIG. 3D. This is accomplished by using a series etch recipes comprising gases as follows: for ON layer (130): $CF_4$, $C_2F_6$, or $Cl_2$; for $WS_i$ layer (150): $SF_6$ or $Cl_2$; for second polysilicon layer (140): $Cl_2$; and for ONO interpoly layer (130): $CF_4$, $C_2F_6$, or $Cl_2$.

As an important aspect of the present invention, a second gate oxide layer (113'), but thinner than the first gate oxide layer (110'), is next thermally grown over the peripheral logic region (P). The thermal oxidation is preferably performed in an oxidation furnace in a temperature range of between about 750 to 1000° C. using dry oxygen similar to the thermal oxidation used to form the first gate oxide layer. This thermal oxidation also forms an oxide layer on the ON layer (160). Preferably the second gate oxide layer (113') is grown to a thickness between about 40 to 400 Å. It will be appreciated by those skilled in the art that the second gate oxide layer (113') of region (P) different from the first gate oxide layer (110) of region (C) together form the dual-gate oxide of the embedded flash memory of this invention. Thus, a thin gate oxide has been formed in the peripheral logic region to enhance the FET device performance there, while providing a thicker gate oxide for the higher gate voltage requirement on the access transistors in the memory cell region. Furthermore, the two differently thick oxides of the dual-gate oxide layers have been formed independently and without affecting each other, such as the case of a protective photoresist layer of prior art that would be used to first etch one gate oxide layer and grow the next one, as described earlier in related art.

An intrinsic polysilicon layer is now deposited over the substrate of FIG. 3E, including the cell (C) regions as well as the peripheral (P) regions, where the portions (170) over the (C) region lie on the previous layers underlying ON cap layer (160) of the memory cell while portions (170') over the (P) region lie directly over the new second gate oxide layer (113'). Using another photoresist mask (not shown), the intrinsic polysilicon layer in the peripheral region is patterned to form poly-gate (170') as shown in FIG. 3F. The photoresist mask protects only the poly-gate patterns of region (P) so that all of the intrinsic polysilicon layer (170) of the (C) region is etched away at the same time the poly-gate of region (P) is formed. This is accomplished by using an etch recipe comprising $Cl_2$ gas. Using as a mask the poly-gate (170') so formed, a lightly doped drain (LDD) is next formed by ion implanting phosphorous (P), or arsenic (As), or boron fluoride ($BF_2$) at a dosage level between about $5 \times 10^{12}$ to $5 \times 10^{13}$ atoms/$cm^2$, and energy level between about 20 to 200 KEV.

The stacked gate (165) of the memory cell of region (C) is next defined and etched as shown in FIG. 3G. This is accomplished by forming and patterning a photoresist mask such that the peripheral (P) region is protected. Preferably, the etch recipe comprises for ON layer (130): $CF_4$, $C_2F_6$, or $Cl_2$; for $WS_i$ layer (150): $SF_6$ or $Cl_2$; for second polysilicon layer (140): $Cl_2$; and for ONO interpoly layer (130): $CF_4$, $C_2F_6$, or $Cl_2$. Using the stacked gate as a mask, a mild doped drain (MDD) region is formed by ion implanting the cell with phosphorous at a dosage level between about $5 \times 10^{13}$ to $5 \times 10^{14}$ atoms/$cm^2$ and energy level between about 20 to 100 KEV.

As another aspect of the invention, a source line (107) for the memory cell in region (C) can be defined and formed at this step by using a self-aligned source (SAS) mask. The field oxide along the source line is removed by using an etch recipe comprising gas $CF_4$. This results in selective etching of the field oxide with respect to the silicon substrate. A dual diffused drain (DDD) is next formed by ion implanting the source and drain regions of the cell with arsenic at a dosage level between about $1\times10^{15}$ to $5\times10^{15}$ atoms/cm$^2$ and energy level between about 20 to 100 KEV.

Figure 3H:
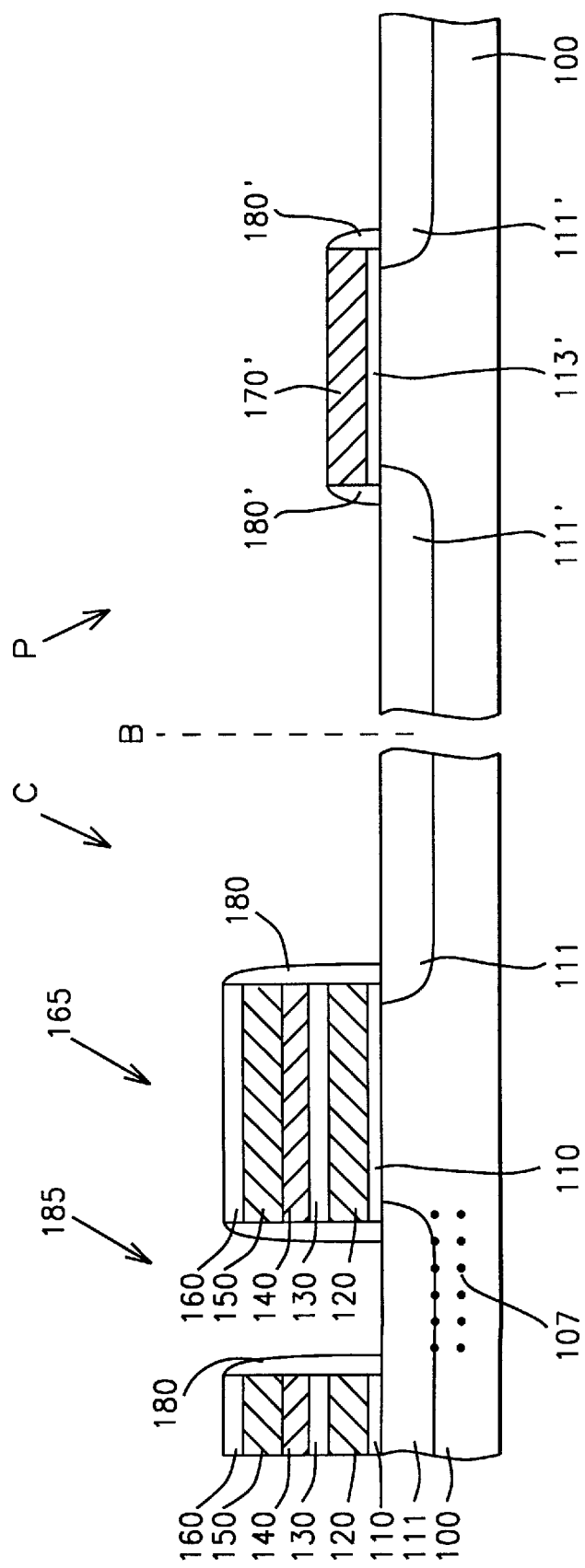
FIG. 3H is a partial cross-sectional view of the same semiconductor substrate of FIG. 3G showing the forming of spacers both in the cell region and the peripheral region and also forming of the source line of the memory cell, according to this invention.

Next, oxide, or nitride spacers (180) and (180') are formed on the side-walls of the stacked gate and the poly-gate respectively, as shown in FIG. 3H. The forming of the spacers is accomplished by depositing and anisotropically etching an oxide or nitride layer (not shown) and they have a thickness between about 500 to 3000 Å. Then source and drain regions (111) and (111') are formed by ion implanting with As, or $BF_2$ at a dosage level between about $1\times10^{15}$ to $5\times10^{15}$ atoms/cm$^2$ and energy level between about 10 to 50 KEV. The spacers so formed and the remaining walls of the stacked gate (165) are covered with a lining layer (190) shown in FIG. 3I. The lining can be an oxide, but it is preferred that it be nitride having a thickness between about 100 to 500 Å. This lining will protect the cell region (C) during the salicide formation in the peripheral region (P) as will be seen in FIG. 3J. It is formed by reacting dichlorosilane ($SiCl_2H_2$) with ammonia ($NH_3$) in an LPCVD at a pressure between about 0.1 to 100 torr, temperature between about 600 to 800° C. and at flow rates between about 0.1 to 10 sccm.

Figure 3I:
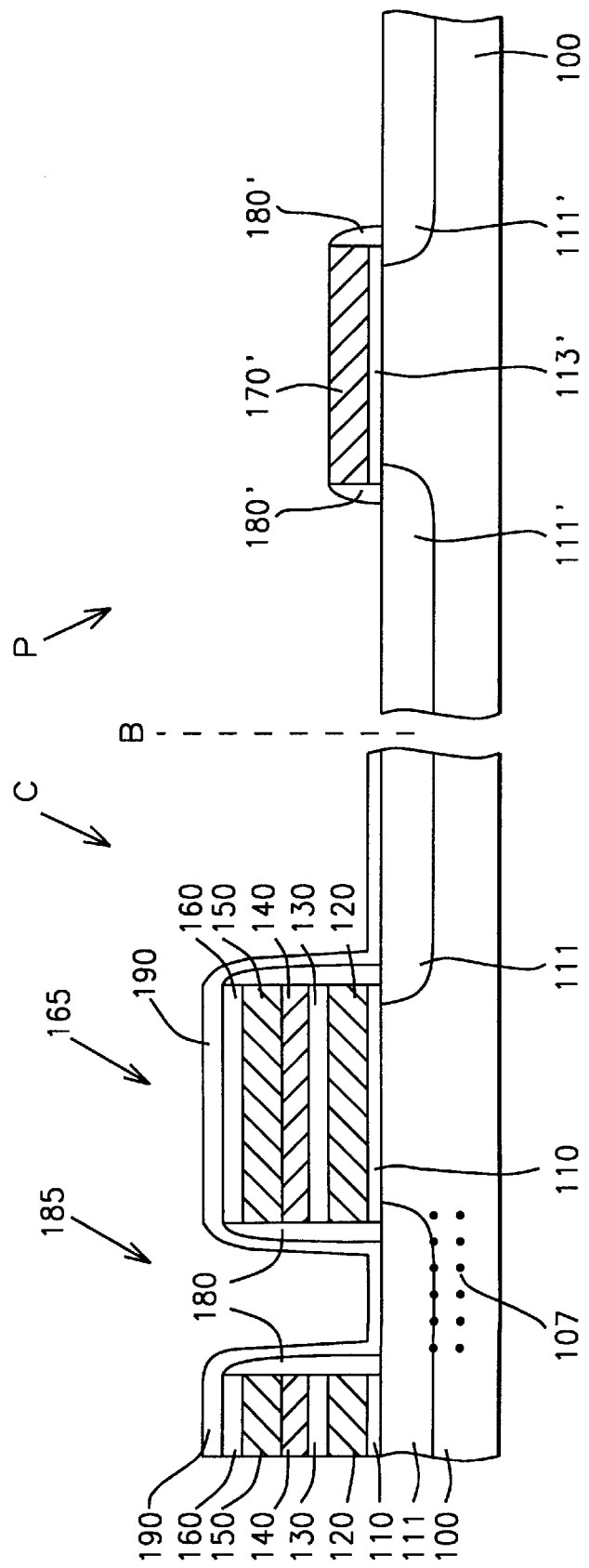
FIG. 3I is a partial cross-sectional view of the same semiconductor substrate of FIG. 3H showing the forming of a conformal lining over the memory cell structure, according to this invention.

The lining layer (190) is removed from the peripheral region (P) as shown in FIG. 3I by using a resistor protecting oxide (RPO) as a mask which protects the (C) region. The removal of the nitride lining in the (P) region is accomplished with an etchant gas such as $CF_4$.

Figure 3J:
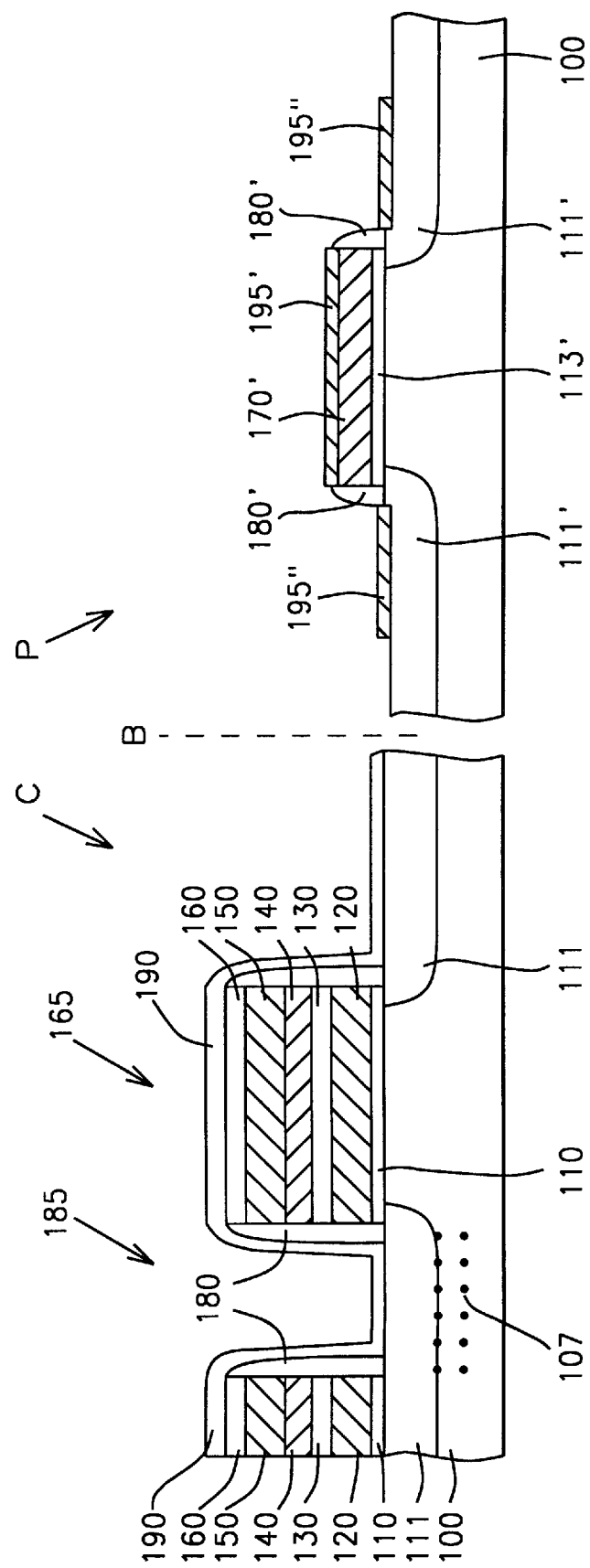
FIG. 3J is a partial cross-sectional view of the same semiconductor substrate of FIG. 3I showing the salicidation of the logic device, according to this invention.
Figure 3K:
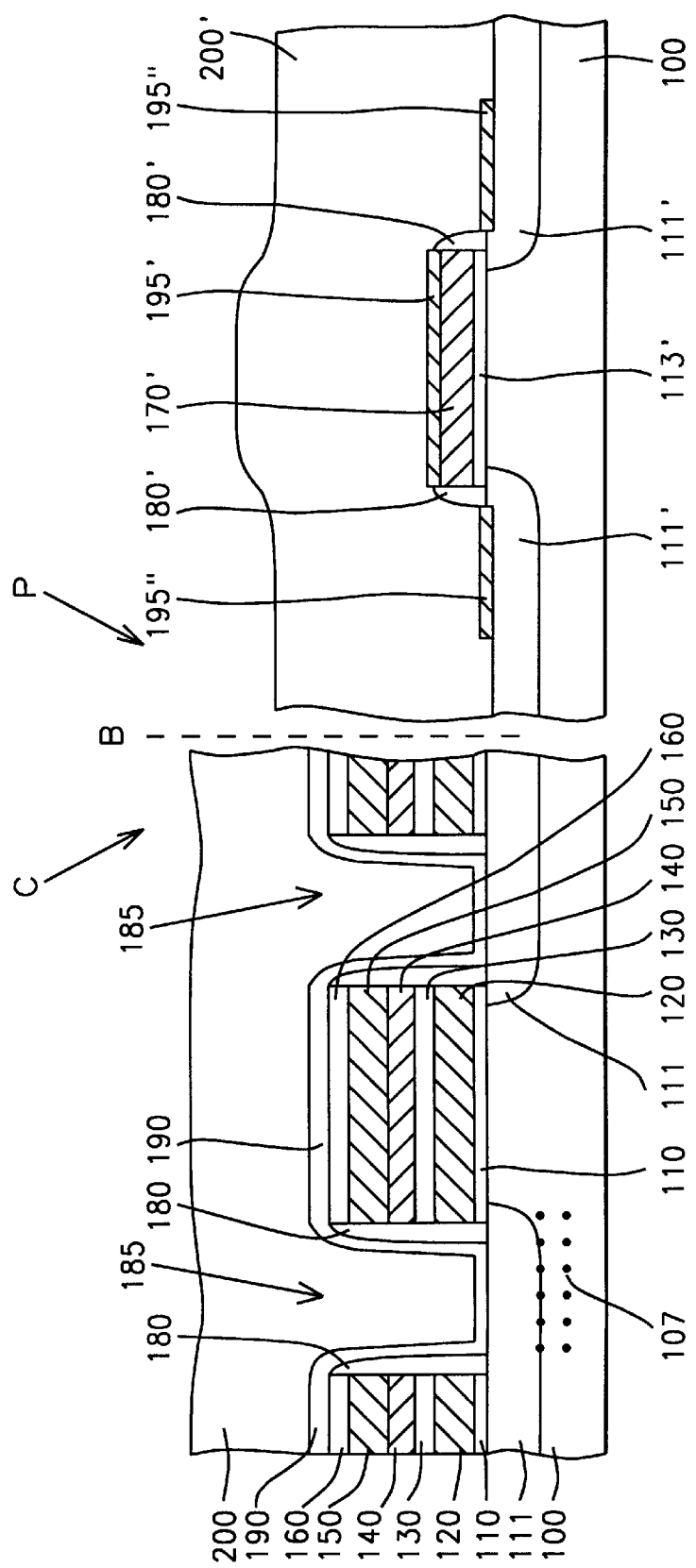
FIG. 3K is a partial cross-sectional view of the same semiconductor substrate of FIG. 3J showing the forming of the interlevel dielectric layer over the substrate, according to this invention.

As another important aspect of the present invention, salicidation in the peripheral region is now performed. This is accomplished preferably by depositing titanium and then subjecting it to a rapid thermal anneal process. The preferred thickness of the titanium silicide is between about 100 to 500 Å. Following the silicide formation, a selective etch removes the unreacted metal portions form non-silicon areas, such as from over the spacers, while leaving the reacted portions (195') on the polysilicon-gate and portions (195") on the silicon substrate as shown in FIG. 3J. Silicides so formed are self-aligned with respect to the poly-gate, and hence forming salicides.

Substrate (100) is next deposited with an interlevel dielectric layer (200). Blanket dielectric layers may be formed from materials including but not limited to silicon oxide materials, silicon nitride materials, and silicon oxynitrides materials formed within integrated circuits through methods including but not limited do CVD, PECVD, PVD sputtering methods. For the preferred embodiment of the present invention, the blanket dielectric layer (200) is preferably formed of a dielectric material chosen from the group of dielectric materials consisting of silicon oxide dielectric materials, silicon nitride, and silicon oxynitride and has a thickness between about 5000 to 20000 Å.

Figure 3L:
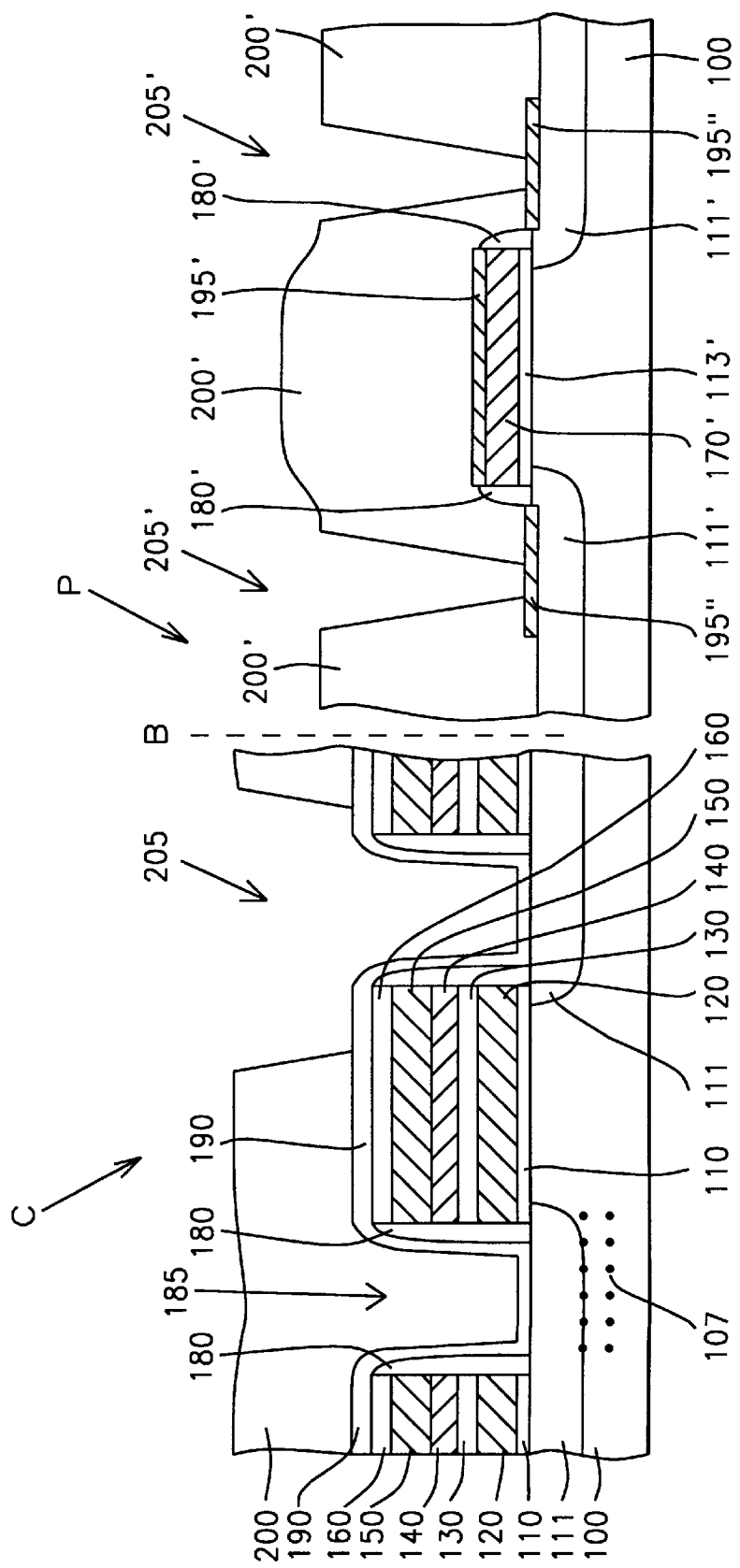
FIG. 3L is a partial cross-sectional view of the same semiconductor substrate of FIG. 3K showing the forming of the simultaneous forming of self-aligned contacts (SAC) in the memory cell and in the logic device by using a single mask, according to this invention.

Dielectric layer (200) is next etched to form contact holes both in the cell region (C) and the peripheral region (P). However, as a main feature and key aspect of the present invention, a single mask can be used to form the contact holes simultaneously in both regions as shown in FIG. 3L. Here, hole (205) shown in the cell region is self-aligned with respect to the stacked gate, hence the SAC process of the present invention. At the same time, the contact holes (205') of the peripheral region are also formed by using the same photomask (not shown) containing both the SAC and the salicide contact hole patterns. The etch is performed with a recipe comprising $CF_4$ or $CHF_3$. Subsequent to the forming of the contact holes, (205) and (205'), in the respective regions of the substrate, the usual back-end processes of semiconductor manufacturing, such as forming of the various metallized layers, are continued to completion.

Figure 3M:
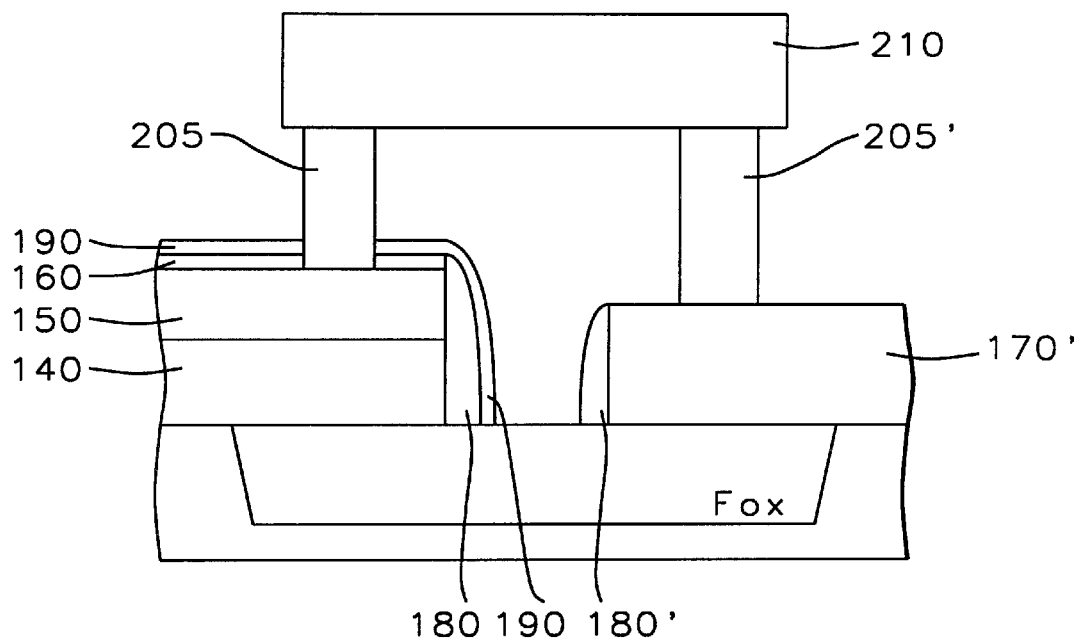
FIG. 3M is a partial cross-sectional view of the same semiconductor substrate of FIG. 3A showing the salicide and SAC structures of this invention at the common boundary between the cell region and the logic device, according to this invention.
Figure 3N:
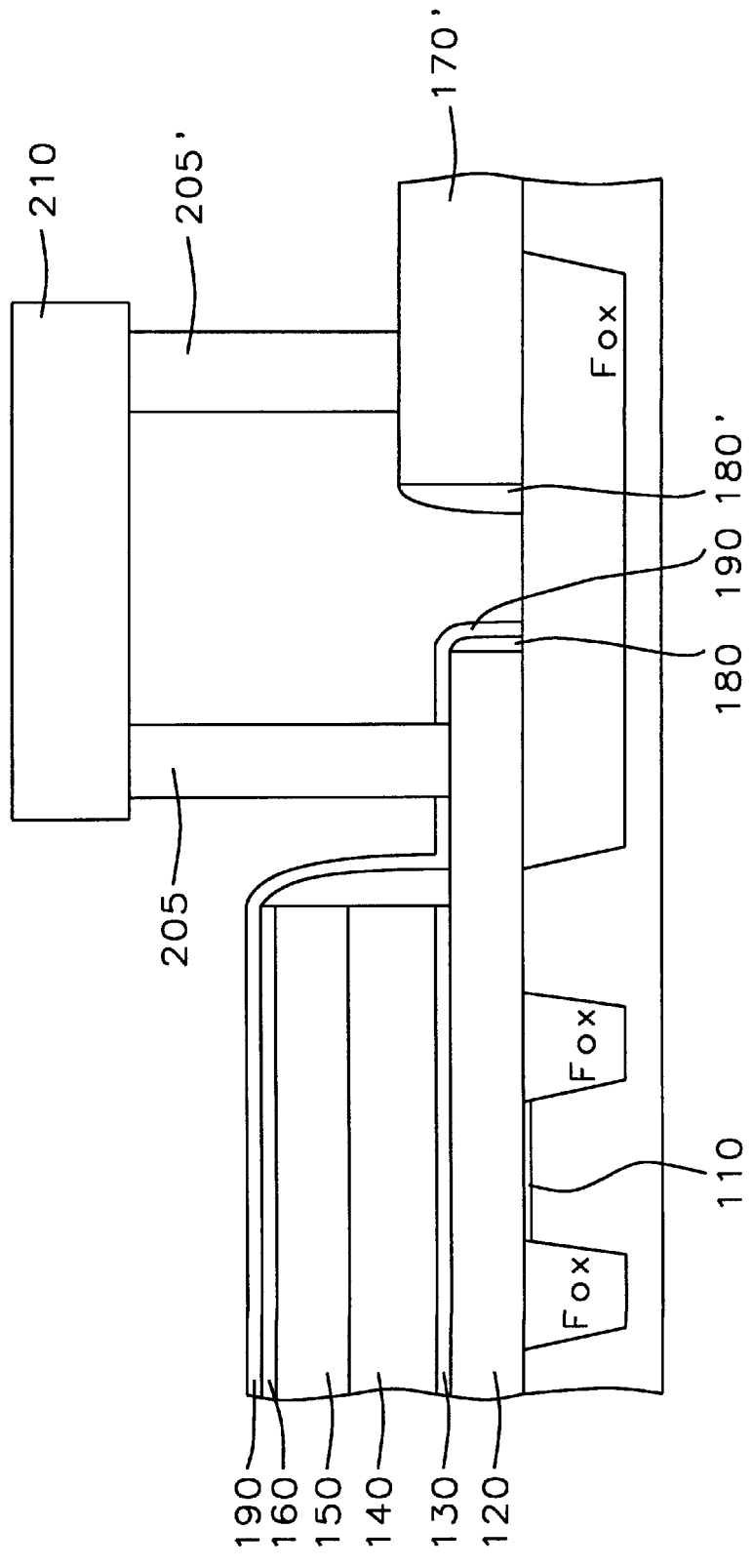
FIG. 3N is a partial cross-sectional view of the same semiconductor substrate of FIG. 3A showing the stacked gate structure of this invention in the memory cell region, according to this invention.
Figure 30:
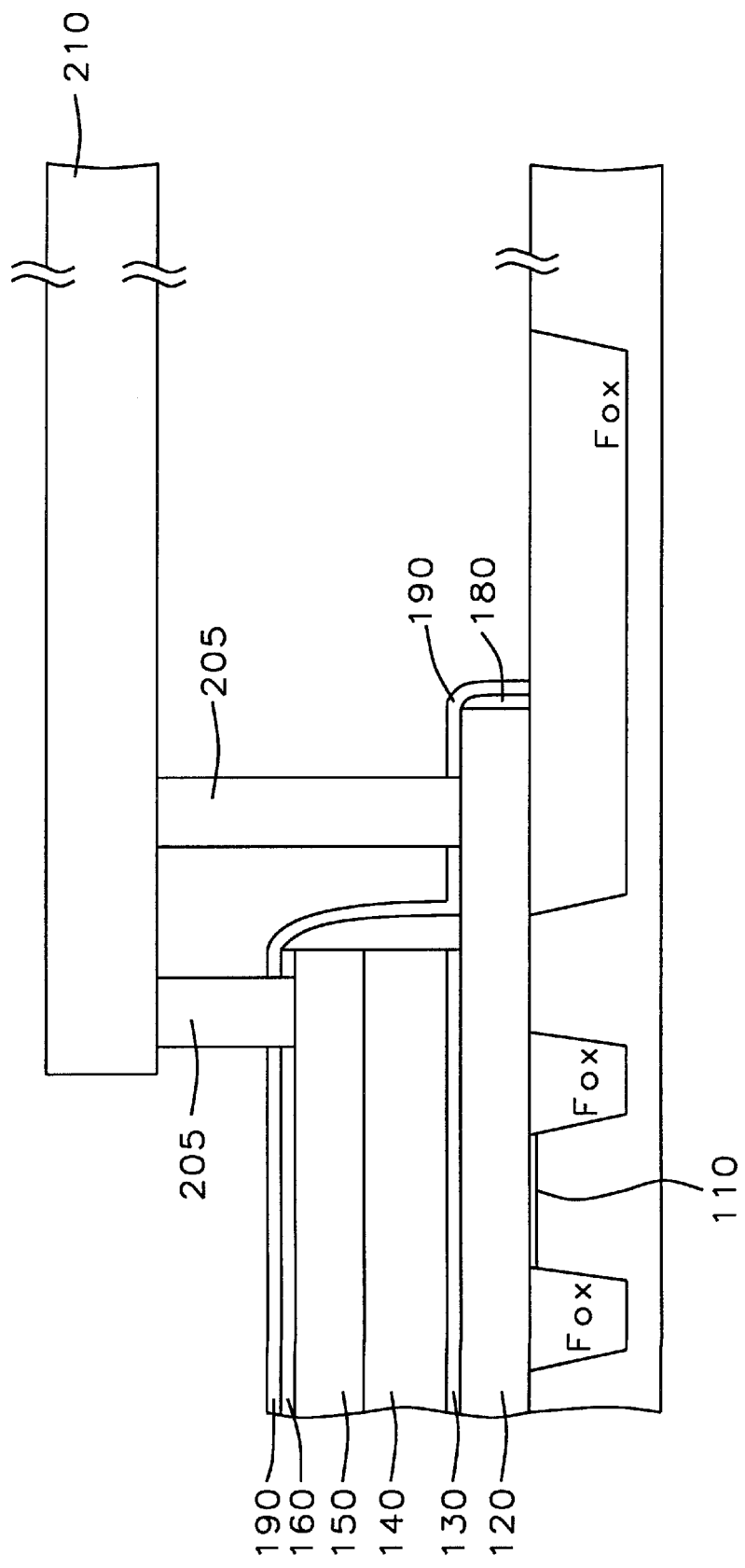

The resulting SAC and salicide structures of the present invention are shown in FIGS. 3M–3O. FIG. 3M shows the structures at the common boundary (B) between the cell (C) region and the peripheral (P) region, where first metal layer (210) interconnects the devices of single poly gate in the two regions. FIG. 3N, on the other hand, shows the stacked gate structure of the cell region. Finally, FIG. 3O shows a device with tunnel oxide. Thus, for the device shown in FIG. 3N, metal line (210) is used to connect the contact on first poly (120) of the cell region with the periphery poly (170'). Therefore, first poly is the control gate for the device with tunnel oxide (110) shown in FIG. 3N. By the same token, in the device shown in FIG. 3O, first poly (120) is again the control gate for the device with the tunnel oxide; however, this time the first poly of the cell region is connected to the first poly of the periphery through a shorted connection between the first poly (120) and the silicide layer (150) which in turn is connected to the poly of the periphery through the metal interconnect (210).

In the descriptions of the embodiments given above, numerous details were set forth, such as specific materials, process parameter, etc., in order to provide a thorough understanding of the present invention. It will be obvious, however, to those skilled in the art that these specific details need not be employed to practice the present invention.

That is to say, while the invention has been particularly shown and described with reference to the preferred embodiments thereof, it will be understood by those skilled in the art that various changes in form and details may be made without departing from the spirit and scope of the invention.

What is claimed is:

1. A combined method of forming salicide and SAC structures on a semiconductor device comprising the steps of:

providing a semiconductor substrate having well regions;

defining device regions on said substrate, said device regions comprising a first device region and a second device region;

forming field oxide regions surrounding and electrically isolating said device regions on said substrate;

forming a first gate oxide layer on said first and second device regions;

depositing a first polysilicon layer over said first gate oxide layer and elsewhere on said substrate;

doping said first polysilicon layer;

patterning by photoresist masking and anisotropic plasma etching said first polysilicon layer leaving portions over said first device region and exposing said first gate oxide over said second device region;

forming a first interpoly oxide layer over said portions of said first polysilicon over said first device region and elsewhere on said substrate;

depositing a second polysilicon layer over said first interpoly oxide layer on said substrate;

depositing a silicide layer over said second polysilicon layer on said substrate;

forming a cap layer over said silicide layer on said substrate;

removing from second device region the stacked layer of cap layer, said silicide layer, said interpoly and intergate oxides and thus exposing surface area of said semiconductor substrate in said second device region;

forming a second gate oxide layer over said second device region;

depositing an intrinsic polysilicon layer over said first and second device regions on said substrate;

patterning by photoresist masking and anisotropic plasma etching said intrinsic polysilicon layer leaving portions over said second device region to form a poly-gate and removing said intrinsic polysilicon from elsewhere on said substrate including said second device regions;

performing a first ion implant over said second device region;

forming a stacked gate in said first device region;

performing a second ion implant over said first device region;

defining a device source line in said first device region;

performing a third ion implant in said first device region;

forming oxide spacers on the side-walls of said stacked gate in said first device region and on the side-walls of said poly-gate in said second device region;

performing a fourth ion implant to form source and drain regions;

forming a conformal layer covering said first and second device regions;

forming a resistor protective oxide layer over said first device region;

removing said conformal layer from said second device region;

performing salicidation in said second device region;

depositing an interlevel dielectric layer over said substrate;

etching self-aligned contact holes in said interlevel dielectric layer in said first and second device regions; and forming metal in said self-aligned contact holes to continue with the completion of the manufacturing of the semiconductor devices.

2. The method of claim 1, wherein said well regions are N-type and P-type.

3. The method of claim 1, wherein said first device region is the memory cell area for a nonvolatile flash memory device.

4. The method of claim 1, wherein said second device region is the logic device area for a nonvolatile flash memory device.

5. The method of claim 1, wherein said forming said field oxide regions is accomplished by LOCOS.

6. The method of claim 1, wherein said forming a first oxide layer is accomplished by thermal oxidation at a temperature between about 750 to 1000° C.

7. The method of claim 1, wherein said first gate oxide layer has a thickness between about 50 to 200 Å.

8. The method of claim 1, wherein said depositing a first polysilicon layer is accomplished by LPCVD method employing silane $SiH_4$ as a silicon source material at a temperature range between about 500 to 800° C.

9. The method of claim 1, wherein said first polysilicon layer has a thickness between about 500 to 2000 Å.

10. The method of claim 1, wherein said doping said first polysilicon layer is accomplished in-situ by adding a dopant phosphine ($PH_3$) to the chemical vapor deposited (CVD) reactant gas silane.

11. The method of claim 1, wherein said forming a first interpoly oxide layer is accomplished by deposition oxide/nitride/oxide (ONO) at a temperature between about 500 to 800° C.

12. The method of claim 1, wherein the thickness of said interpoly oxide is between about 100 to 500 Å.

13. The method of claim 1, wherein said depositing a second polysilicon layer is accomplished by LPCVD method employing silane $SiH_4$ as a silicon source material at a temperature range between about 500 to 800° C.

14. The method of claim 1, wherein said second polysilicon layer has a thickness between about 500 to 3000 Å.

15. The method of claim 1, wherein said doping said second polysilicon layer is accomplished in-situ by adding a dopant phosphine ($PH_3$) to the chemical vapor deposited (CVD) reactant gas silane.

16. The method of claim 1, wherein said depositing a silicide layer is accomplished by sputter-depositing tungsten silicide (WSi) to a thickness between about 500 to 3000 Å.

17. The method of claim 1, wherein said forming a cap layer is accomplished by depositing oxide/nitride (ON) at a temperature between about 500 to 800° C.

18. The method of claim 1, wherein said cap layer has a thickness between about 500 to 5000 Å.

19. The method of claim 1, wherein said removing from second device region said stacked layer, and said exposing surface area of said semiconductor surface in second device region is accomplished with an etch recipe comprising gases $CF_4$, $C_2F_6$, or $Cl_2$ for ON layer; $SF_6$ or $Cl_2$ for $WS_i$ layer; $Cl_2$ for second polysilicon layer; and $CF_4$, $C_2F_6$, or $Cl_2$ for ONO interpoly layer.

20. The method of claim 1, wherein said forming a second gate oxide layer is accomplished by thermal growth at a temperature between about 750 to 1000° C.

21. The method of claim 1, wherein said depositing an intrinsic polysilicon layer is accomplished by LPCVD method employing silane $SiH_4$ as a silicon source material at a temperature range between about 500 to 800° C.

22. The method of claim 1, wherein said intrinsic polysilicon layer has a thickness between about 500 to 2000 Å.

23. The method of claim 1, wherein said intrinsic polysilicon layer to form said poly-gate and said removing said intrinsic polysilicon from elsewhere on said substrate is accomplished with a recipe comprising $Cl_2$ gas.

24. The method of claim 1, wherein said performing a first ion implant over said second device region is accomplished with phosphorous or boron at dosage level between about $5\times10^{12}$ to $5\times10^{13}$ atoms/$cm^2$ and energy between about 100 to 200 KEV.

25. The method of claim 1, wherein said forming a stacked gate in said first device region is accomplished with a photoresist mask having gate pattern and etching through said pattern using an etch recipe comprising gases $CF_4$, $C_2F_6$, or $Cl_2$ for ON layer; $SF_6$ or $Cl_2$ for $WS_i$ layer; $Cl_2$ for second polysilicon layer; and $CF_4$, $C_2F_6$, or $Cl_2$ for ONO interpoly layer.

26. The method of claim 1, wherein said performing a second ion implant over said first device region is accomplished with phosphorous ions at a dosage level between about $5\times10^{13}$ to $5\times10^{14}$ atoms/$cm^2$ and energy level between about 20 to 100 KEV.

27. The method of claim 1, wherein said defining a device source line in said first device region is accomplished with a self-aligned source (SAS) mask.

28. The method of claim 1, wherein said performing a third ion implant in said first device region is accomplished with arsenic ions at a dosage level between about $1\times10^{15}$ to $5\times10^{15}$ atoms/cm$^2$ and energy level between about 20 to 100 KEV.

29. The method of claim 1, wherein oxide spacers have a thickness between about 500 to 3000 Å.

30. The method of claim 1, wherein said fourth ion implant to form source and drain regions is accomplished with arsenic or bromine fluoride ions at a dosage level between about $1\times10^{15}$ to $5\times10^{15}$ atoms/cm$^2$ and energy level between about 10 to 50 KEV.

31. The method of claim 1, wherein said conformal layer is a lining formed by depositing oxide or nitride at a temperature between about 600 to 800° C.

32. The method of claim 1, wherein said conformal layer has a thickness between about 100 to 500 Å.

33. The method of claim 1, wherein said resistor protective layer has a thickness between about 100 to 500 Å.

34. The method of claim 1, wherein said removing said conformal layer from said second device region is accomplished with a recipe comprising gas CF$_4$.

35. The method of claim 1, wherein said performing silicidation is accomplished by sputter depositing titanium silicide to a thickness between about 100 to 500 Å.

36. The method of claim 1, wherein said interlevel dielectric has a thickness between about 5000 to 20000 Å.

37. The method of claim 1, wherein said etching self-aligned contact holes in said interlevel dielectric layer in said first and second device regions is accomplished with a recipe comprising gas CF$_4$ or CHF$_3$.

38. The method of claim 1, wherein said forming metal in said self-aligned contact holes is accomplished by depositing tungsten.

39. A combined method of forming salicide and SAC structures including a dual-gate oxide on a semiconductor substrate for a flash memory device comprising the steps of:

providing a semiconductor substrate having well regions, active and passive regions defined having a memory cell region and a peripheral logic region;

forming a dual-gate oxide layer having a first portion in said cell region and a second portion in said logic region;

forming a silicided stacked gate in said cell region;

forming a self-aligned source line in said cell region;

removing said second portion of said dual-gate oxide layer from said logic region and forming a new gate oxide layer on substrate in said logic region forming a new second portion of said dual-gate oxide layer;

forming a single salicided gate over said new second portion of said dual-gate oxide layer in said logic region;

forming an interlevel dielectric layer over said cell region and logic region;

forming simultaneously self-aligned contact holes in said cell region and said logic region; using a combined single mask; and forming metal in said self-aligned contact holes to continue completing the standard back-end processing the manufacture of flash memories.

40. The method of claim 41, wherein said first portion of said dual-gate oxide layer in said cell region has a thickness between about 50 to 200 Å.

41. The method of claim 39, wherein said new second portion of said dual-gate oxide layer in said logic region has a thickness between about 40 to 200 Å.

42. The method of claim 39, wherein said stacked gate in cell region has a dope first polysilicon floating gate and a doped and silicided polysilicon control gate each having a thickness between about 500 to 2000 Å.

43. The method of claim 39, wherein said stacked gate has an intervening interpoly oxide between said floating gate and said control gate, with an oxide cap which in turn is lined with a nitride layer having a thickness between about 500 to 5000 Å.

44. The method of claim 39, wherein said self-aligned source line formed with a SAS mask.

45. The method of claim 39, wherein said single salicided gate is formed of intrinsic polysilicon and tungsten silicide.

46. The method of claim 39, wherein said forming simultaneously said self-aligned contact holes in said cell region and said logic region is accomplished by using a combined single mask having both cell and logic contact hole patterns.

47. The method of claim 39, wherein said forming metal in said self-aligned contact holes is accomplished by depositing tungsten.

* * * * *